US 6,396,279 B1

(12) United States Patent
Gruenert (10) Patent No.: US 6,396,279 B1
(45) Date of Patent: May 28, 2002

(54) METHOD AND DEVICE FOR TESTING DIFFERENTIAL PROTECTION RELAYS OR DIFFERENTIAL PROTECTION RELAY SYSTEMS

(75) Inventor: Hagen Gruenert, Falkensee (DE)

(73) Assignee: Omicron Electronics GmbH, Altach (AT)

( * ) Notice: Subject to any disclaimer, the term of this patent is extended or adjusted under 35 U.S.C. 154(b) by 0 days.

(21) Appl. No.: 09/194,806

(22) PCT Filed: Mar. 6, 1998

(86) PCT No.: PCT/EP98/01316

§ 371 (c)(1),
(2), (4) Date: Jun. 24, 1999

(87) PCT Pub. No.: WO98/45721

PCT Pub. Date: Oct. 15, 1998

(30) Foreign Application Priority Data

Apr. 4, 1997 (DE) .......................................... 197 13 748

(51) Int. Cl.$^7$ ............................................... H02H 7/26
(52) U.S. Cl. ....................................... 324/424; 324/418
(58) Field of Search .................................. 324/521, 522, 324/547, 552, 555, 418, 424, 618

(56) References Cited

U.S. PATENT DOCUMENTS 3,983,456 A * 9/1976 Suzuki ...................... 317/28 R
4,177,419 A   12/1979 Fiorentzis ................... 324/418
4,331,997 A * 5/1982 Engel et al. ................. 361/93

(List continued on next page.)

FOREIGN PATENT DOCUMENTS

DE  27 35 811 A1   8/1977
EP  0 561 146 A2   2/1993
EP  93 101 911.1   2/1993
SU       779930   11/1980
SU      1270778   11/1986

OTHER PUBLICATIONS

Michael Igel and Peter Schegner, "Prufung von Schutzeinrichtungen," in *ETZ Electrotechnische Zeitschrift* 116, No. 18, Berlin, Germany, pp. 14–22, Nov. 18, 1995.

(List continued on next page.)

*Primary Examiner*—Safet Metjahic
*Assistant Examiner*—Vincent Q. Nguyen
(74) *Attorney, Agent, or Firm*—Lackenbach Siegel, LLP (57) ABSTRACT

A relay test apparatus useful for the testing of three-phase differential protection relay systems with up to three windings including the corresponding current transformers (Cts). Especially for differential protection relays, which protect a three phase transformer, the transformer with its vector group (delta and wye windings including phase shift) is simulated within the test software. From the simulation the injected test currents are calculated and applied to the relay (via current signal generators), and the reaction of the relay is measured back (via a trip contact). This is a common technique for relay text apparatus. Normally the magnitude of the injected signals has to be specified. The characteristics are differential projection relays are specified as operating characteristics in an IDiff/IStab two-dimensional plane and as trip time characteristics in the t over IDiff plane. The magnitudes IDiff and IStab are "modeled" (or transformed) quantities, which are derived from the injected test currents and the simulation model (including the vector group correction and CT ratios). Through the modeling of the protected object (the transformer) it is possible, now, to test in this modeling "domain" and specify fault scenarios (for specific IDiff/IStab values and specific fault types (e.g., L1 to neutral or L1–L2)) and the software calculates the injected currents for all three phases and for up to three windings through the internal model. With this technique it is possible to verify the parameters of the characteristics in the modeling domain exactly.

12 Claims, 6 Drawing Sheets

U.S. PATENT DOCUMENTS

| | | | | |
|---|---|---|---|---|
| 4,352,137 A | * | 9/1982 | Johns | 361/82 |
| 4,634,981 A | * | 1/1987 | Shimp et al. | 324/424 |
| 4,772,978 A | * | 9/1988 | Oura et al. | 361/36 |
| 4,891,570 A | * | 1/1990 | Nakamura et al. | 323/210 |
| 5,444,377 A | * | 8/1995 | Del Vecchio et al. | 324/424 |
| 5,576,625 A | * | 11/1996 | Sukegawa et al. | 324/424 |
| 5,659,453 A | * | 8/1997 | Russell et al. | 361/93 |
| 5,734,576 A | * | 3/1998 | Klancher | 361/63 |

OTHER PUBLICATIONS

Michael Igel and Peter Schegner, "Prufung von Schutzeinrichtungen," in 0834 *ETZ Elektronische Zeitschrift,* 116 (1995) Nov., No. 18, Berlin, Germany.

Translation of European Patent Office Action of Oct. 26, 2000, in Appln. No. 98 916 893.5–2214 of Omicron Electronics GmbH (Inventor: Hagen Gruenert).

* cited by examiner

METHOD AND DEVICE FOR TESTING DIFFERENTIAL PROTECTION RELAYS OR DIFFERENTIAL PROTECTION RELAY SYSTEMS

BACKGROUND OF THE INVENTION

The object of the invention is a method and a device for testing differential protective relays and systems. Differential protective relays and systems of such a type are used as protective equipment for the monitoring of the widest possible variety of electrical equipment used in power engineering. Electrical equipment of this type can include, for example, a high-voltage or medium-voltage transformer, a bus bar, a generator, a line or a cable, and other similar kinds of electrical equipment. For safety reasons, these types of electrical equipment used in power engineering are provided with differential protective relays which have the job of disconnecting the electrical equipment to be protected from the power supply network in the event of a fault.

The object of the present invention is a method and a device for testing such differential protective relays and differential protective systems, with the goal of safeguarding the function of such differential protective relays and differential protective systems (guaranteeing their protective function).

In conjunction with that, the function testing of the differential protective relay must be possible with installation-specific parameterizations and settings.

By using the test method that is being introduced, it is possible to verify the correctness of the installation-specific design, parameterization and settings, and wiring of the differential protective relay or differential protective system, as well as its protective function.

A further object of the invention is the replacement and improvement of the primary test methods which have previously been carried out, e.g., the 380-volt method, which, due to the small test values, permit only limited and often unclear information.

The designation differential protective system includes the matching converter circuit, particularly with the use of conventional differential protective equipment.

At the present time, numerical differential protective equipment with software-implemented switch assembly matching and zero current elimination are being tested almost exclusively by means of a single-sided current feed at a single point in the characteristic region, which does not permit reliable information concerning the functional capability of the differential protective relay. A few large utilities are testing differential protective relays by means of a double-sided current feed with two controllable current sources, whereby the current vector calculation and the test wiring is difficult and requires specialized knowledge, and is limited to a single-pole and double-pole fault simulation. Finally, the latter utilities do special testing of the correctness of the design, parameterization and setting, and wiring of the differential protective system on transformers by means of a three-phase primary test method (380-volt method). Tests in the characteristic region are also carried out by manufacturers of protective equipment by using two current generators and parameterized switch assembly Yy0 and Yy6.

Such known test methods can, for example, be found in the "IEEE Guide for Differential and Polarizing Relay Circuit Testing", IEEE C37.103–1990, ISBN 1-55937-058-0, pages 21 ff.

The known test instructions show that testing is being done with the simplest of equipment. As a rule, several formulas and current tables are shown for a simple testing of the relay. The testing is usually carried out with single-sided current feed. On occasion, a second current generator is used in order to be able to adjust the stabilization current independently of the differential current.

A complete check of the relay and the protective systems without rewiring is completely impossible, as is the testing of the entire stabilization characteristic curve. It is not always possible to carry out the known 380-volt test due to conditions at the site, and the test currents that are available are often too small to be able to provide meaningful results.

SUMMARY OF THE INVENTION

It is therefore the task of the present invention to further development a method and a device of the type mentioned at the beginning, so that all of the parameters relevant to the protective function of a differential protective relay or system can be tested in a simple and exact way, and thus a complete test is possible.

To perform the required task, the invention is characterized by the features of claim 1.

A test method is suggested which provides for a three-phase circuit for connecting a three-phase current system to the primary, secondary and, if applicable, tertiary side (6–9 current generators), plus, if applicable, the additional connecting of separate zero currents.

The item under test is connected once, and can then be tested in its complete functionality. The checking is not carried by means of any kind of current values that are calculated manually or read from a table, instead, it is carried out directly in the transformed level of the stabilization characteristic curve $I_{DIFF/ISTAB}$ (operating characteristic $I_{DIFF}/I_{BIAS}$) and/or the matched (virtual) currents $I_S=f(I_P)$. The calculation of the current vectors is carried out automatically, taking into consideration the electrical equipment to be protected, the current converter ratios, the fault type and the fault location.

With this new test method, possibilities are provided for the testing of differential protective systems with respect to function and to the object being tested. The method allows the testing of the special parameters of line-differential protective devices and bus-bar protective devices, as well as of transformer, generator and motor differential protective devices which process the measured value "current" of all of the electrically connected protected objects with regard to their current differential or phase angle difference. The complexity of the protected object nodal point is limited to three legs.

The foundation of all stationary test methods is the model of a transformer with three windings. The other protected objects can also be simulated by means of this model through the selection of specific parameters. The allocation of the voltage levels remains fixed. The left winding with feed possibility is always used as the primary side (P). The right winding with feed possibility is always used as the secondary side (S). The tertiary side (T) can be used as pure fault or load side only with a three-winding device or a three-leg device (bus bar).

It is an essential feature of the invention that the protected object is simulated by means of software so that it is simulated with its most important parameters. This simulation of the protected object takes place in the test facility itself The currents calculated in the simulation are then output to the connected differential protective relay or system.

For the test in this case, the test facility with 6 to 9 current generators instead of the current converter is connected directly to the protective relay or system that is to be tested. A simulation of the transformer behavior is carried out in the test facility, and the calculated current vectors are fed into the protective relay or system that is to be tested:

A method for testing the switch assembly matching and the correction of the value will now be explained in the following.

In the case of the transformer, the test currents of the individual windings are dependent upon the effective switch assembly and the numerical index of the switch assembly, and differ in their phase positions. With star or delta transformers, the use of stepping switches, or because of differing $I_{NConverter}/I_{NTransformer}$ ratios of the windings to be compared, the values of the test currents are also different. The current comparison must thus be traced back to the currents flowing in the individual branches or to a reference winding.

The correct calculation of the currents to be compared from the measured secondary line currents is verified by the test method described here. In addition, a check is carried out with regard to the correct parameterization of the protective device and the correct design and implementation of the protective system, along with the device function with respect to the matching of the measured values. The correct protection device function is tested with identical parameterization of the protection device and the test environment.

In the present description, the ideal protected object is simulated with no consideration of the effects of the voltage regulation, copper and iron losses, or charging currents.

The basis for the vector calculation is the model of a three-winding transformer with switchable feed side. For flow-through faults, the feed can be from one side only. The primary or secondary winding can be selected as the feed side. The feed side is automatically switched after a fault location has been selected. For example, fault on the P side=>feed on the S side.

The standard fault types 1-pole, 2-pole, 3-pole plus the 3-pole operating state are realized as flow-through currents in the manual mode within the range $0-I_{NTransformer}$ 100%/Uk. In the case of a three-winding transformer, a three-phase load state can be selected on one winding, while in addition a fault case can be selected on the given other one. As a result, the item under test is subjected to measurement values on all ends simultaneously. The test values of the feed side are calculated from the test values of the load or fault side by means of the transformer model mentioned.

In the following, a method for the testing of the trip characteristic curve $I_{DIFF}=f(I_{STAB})$ is described.

The detection of a fault in the protection range does not depend solely on the size of a flowing differential current $I_{DIFF}=|I_P-I_S|$. During the operating state and when there are external faults, differential currents occur, the causes for which can be found in the magnetization current influence of the step switch ratio error of the converter and which may provide an incorrect image of the state of the protected object. For that reason, it is important to use a suitable stabilizing value $I_{bias}\approx|I_P|+|I_S|$ (or similar definitions). The continuously described values $I_P$ and $I_S$ are virtual values which are not immediately apparent from the calculation model, and which are used as input values for the calculation in the Diff/Stab level in the protective device. They are the starting point for the calculation of the test values.

The checking of the described function must be possible with a protective device parameterized in an installation-specific way, and it is used as a verification of the parameterized trip characteristic curve. In conjunction with that, it should be possible for the trip characteristic curve to be recorded through evaluation of the off command by means of binary input standard fault types. This means that the function is based on testing that is multi-sided and, depending on the particular fault type, multi-pole.

The testing is carried out with concrete fault conditions (e.g., 2-pole fault on the secondary side) which are brought into this function by means of the symbol for the protected object in accordance with the calculation model.

The testing is carried out automatically or manually in the DIFF-STAB level (see test environment).

It should be possible to select between two methods. The necessary differential current is generated by means of a pure difference in magnitude of the currents to be compared, $I_P$, $I_S$.

For the single-pole fault, a parameter is to be provided which takes into consideration the treatment of the zero system in the protective device. If the protective device works with its own zero current measurement, no special conditions have to be taken into consideration. If the calculated zero current is calculated from the measured line currents, then the $I_P$, $I_S$ calculated from the selected DIFF and STAB values must be internally multiplied by the factor 3/2.

Based upon the comments above, the invention has the following advantages over the state of the art:

No rewiring is needed for conductor-selective testing with various types of faults.

Complicated manual calculation of the required current vectors is not necessary.

Testability of transformer differential protective equipment with all switch assemblies and three-pole faults.

Coordinated output of up to 9 (or 11) test currents.

Testing of the protective device parameterization of numerical relays and the design and implementation of conventional differential protection systems through protected object simulation under substantially better measurement conditions than with the comparable 380-volt method.

Replacement of the 380-volt method, and its disadvantage of the limited test current size resulting from a combination of existing test methods, with the method described here.

The test method allows working directly within the characteristic region of the trip characteristic (operating characteristic).

Method for checking the stabilization behavior of differential protective equipment under any desired normal operating states as well as under external faults.

The essential features of the present invention thus lie in the following technical science:

Test method in which a 3-phase connecting of the test currents is made to each leg or winding (e.g., primary, secondary, tertiary feed in the case of a 3-winding transformer protective relay) of the arrangement to be tested, as well as the optional connection of separate zero currents. A test is thus carried out with 6 to 9 (or 11) current generators.

Test method of differential protective equipment in which the specification of the test values in the transformed levels of the trip characteristic curve is carried out in the form of Idiff and Istab values, and which, by means of a test facility, automatically applies the appropriate current values to the inputs of the equipment to be tested (digital protective relay or conventional protective relay including matching converter) for all simple fault types, while taking into consideration the selected piece of equipment to be protected (line, bus bar, transformer, generator, unit) and its parameters (switch assembly, converter ratio relationships, star point grounding, etc.).

Function-related and protected object-related testing of differential protective devices and systems, and replacement or improvement of the previously used 380-volt method.

The method is used for the testing of the magnitude correction and switch assembly correction, as well as zero-current elimination, particularly during startup.

From the presentation above, it is thus clear that the core of the present invention lies in the fact that now, for the first time, a function-related as well as protected object-related testing of differential protective systems, particularly of differential protective relays can be carried out. That was not possible in the state of the art.

The testing 6f the trip characteristic is carried out by means of two-sided current feed (primary and secondary or primary and tertiary). In the case of three windings, the secondary or the tertiary can be selected.

Fundamentally, a distinction must be made as to which values are used for the calculation of the value pair $I_{DIFF}$ and $I_{STAB}$ in the protective device.

The calculation of the value pair $I_{DIFF}$ and $I_{STAB}$ is carried out in the branch of the reference winding. The currents $I_P$, $I_S$, $I_T$ which are used for the calculation are identical to the branch currents $I_{PS}$, $I_{SS}$, $I_{TS}$ of the reference winding.

With most of the relay manufacturers (Siemens, AEG, ABB), the calculation of the value pair $I_{DIFF}$ and $I_{STAB}$ is carried out in the conductors of a reference side. The reference side can be adjusted within the test environment, the primary winding (winding 1 in the protective device) is to be selected as the default.

Differential relays work conductor-selectively. In order to have a reasonable distribution of current in the individual phases, the relative angle and magnitude relationships in the case of an external fault are used as the basis for the calculation. If the reference winding is defined as the fault side, the current share corresponds to the fault current vector $I_F$. For a fault on the side opposite the reference point, the resulting current share of the reference side must be calculated. This current share in the individual phases, which results from the selected fault type $I_F$ and switch assembly $SG_x$, is to be calculated on the fault side by determining the current matrix M by means of the model before each test, using a different switch assembly and fault type. In the so-called matrix M, the relative magnitude and the vectorial position of the phases is to be stored qualitatively. In contrast to the method described further above, for this test method the occupied coefficients of the fault current vectors $I_F$ are not always one.

Problem: Since with a two-pole fault on the triangle side, there are two currents on the star side with half the magnitude of the third, the characteristic curve is tested at two points simultaneously. Both value pairs have the same rise. Depending on the location in the Diff/Stab level, normalization must be made to the minimum or the maximum line current.

The inventive object of the present invention arises not just from the object of the individual patent claims, but also from the combining of the individual patent claims with each other.

All of the information and features contained in the documentation, including the abstract, in particular, the spatial configuration represented in the drawings, are claimed as being essential to the invention, to the extent that they are new with respect to the state of the art either individually or in combination.

BRIEF DESCRIPTION OF THE DRAWINGS

In the following, the invention is described in more detail with the aid of drawings which represent only one embodiment. In conjunction with that, additional inventive features and advantages which are essential to the invention emerge from the drawings and their description.

The following are shown.

DESCRIPTION OF THE PREFERRED EMBODIMENT

Figure 1:
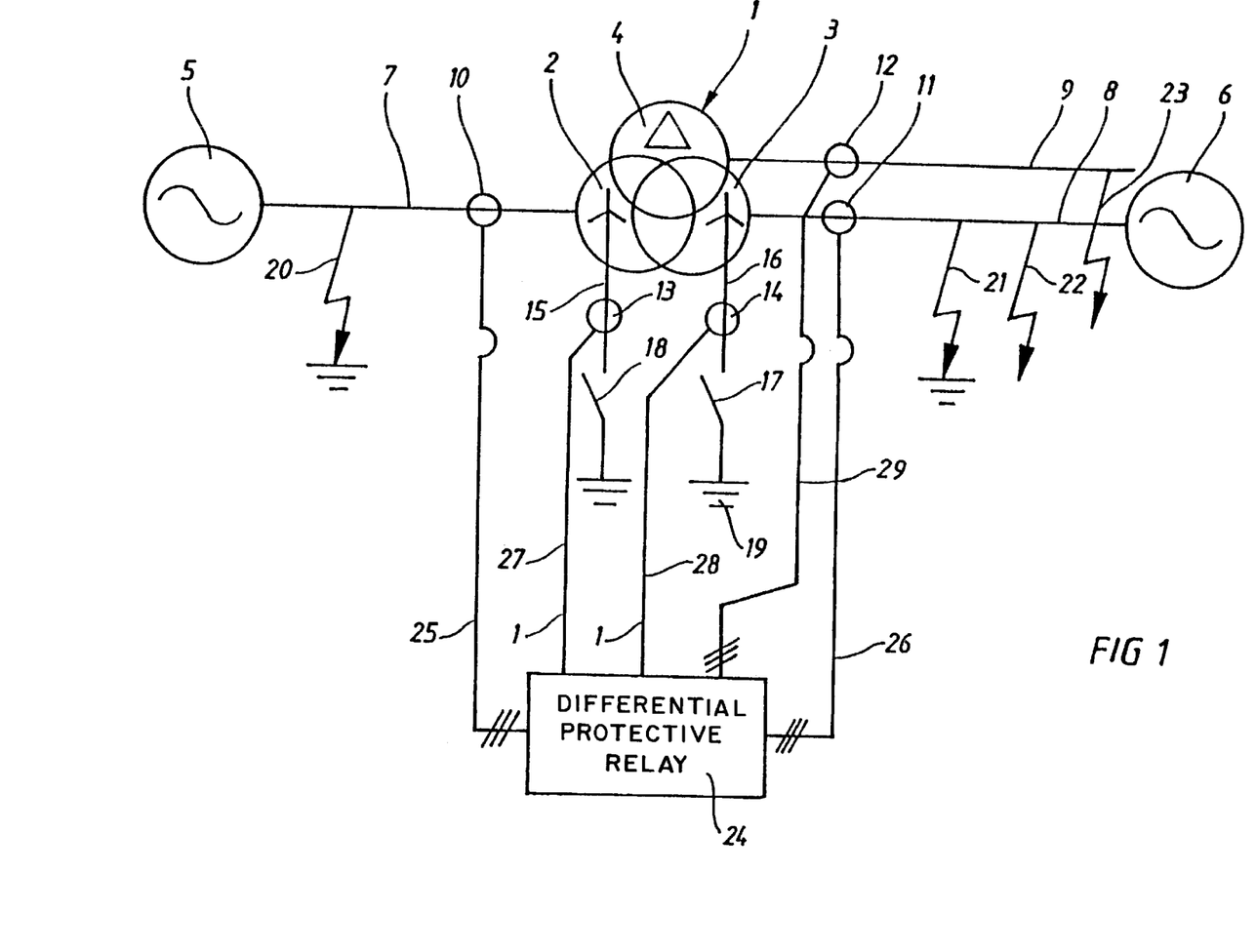
FIG. 1: Schematic representation of a protected object with the differential protective relay to be checked.

Shown in schematic form in FIG. 1 is a protected object 1, which, in the concrete embodiment, can be a generator, a transformer, or another piece of electrical equipment. In the embodiment shown, the protected object consists of a transformer with a primary winding 2, a secondary winding 3 and a tertiary winding 4. The cited windings 2–4 can be linked in a star, zig-zag or triangle.

On the primary side, the feed 5 is carried out from a three-phase generator via a three-phase line 7. Indicated schematically is the fact that faults can occur in the course of this line, such as represented at fault location 20 by a short circuit, for example.

On the secondary side, the feed 6 is also carried out by means of a three-phase generator over a three-phase line 8.

In addition, a fault or a load 23 can be simulated on three-phase line 9 as well.

Of course, it goes without saying that the protected object 1 can also exhibit only a primary winding 2 and a secondary winding 3, with the tertiary winding 4 is omitted. It also goes without saying, that the protected object can also be any other desired piece of electrical equipment, such as a bus bar, a line or cable, a generator, or something similar.

The star points of the cited windings 2, 3 can also be connected to ground 19 by means of lines 15, 16 via associated switches 17, 18.

The switch 17 is intended to represent the fact that the star point secondary of winding 3 is grounded or not grounded. Ground current converters 13, 14 are placed on lines 15, 16. In the same way, placed in the other three-phase current lines 7–9 are current converters 10–12, which carry out the appropriate signal conversion to secondary values in order to form the appropriate input circuits for the differential protective relay 24 to be checked.

Furthermore, also symbolized is the fact that additional fault locations 21, 22 can be present in the region of the three-phase current lines 8, 9.

Each of these can involve one single-pole fault, a two- or three-pole fault, or even a three-phase load which is present on three-phase current lines 7–9.

The lines 25–29 are directed as signal inputs to the differential protective relay 24 via the cited current converters 10–14.

In conjunction with this, Lines 25, 26, 29 are configured as three-phase lines.

Figure 2:
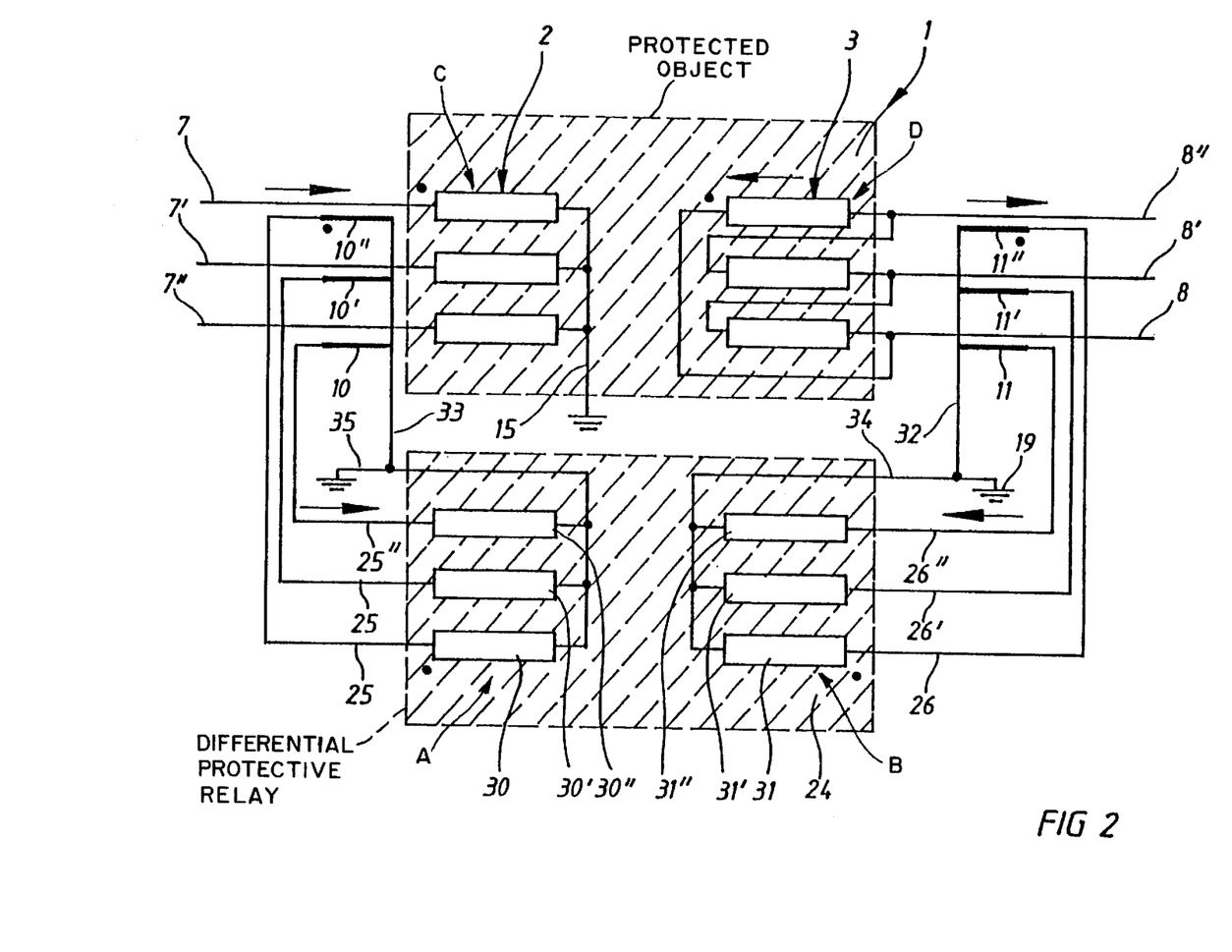
FIG. 2: An embodiment for a numerical relay which is a concrete version of FIG. 1, with current meter arrow definition.

FIG. 2 shows an embodiment which is a concrete embodiment of FIG. 1, in which it can be seen that the protected object 1 is configured as a transformer equipped with primary windings 2 and secondary windings 3, whereby the primary winding is configured as a star or Y winding and the secondary winding as a triangle or delta winding.

The differential protective relay 24 to be tested is connected with the protected object 1 by means of lines 25, 26, which were already explained in FIG. 1.

The same identifiers apply to the same parts, so an explanation of these parts can be dispensed with.

The differential protective relay shown here consists of a primary-side input converter 30 with input windings A, 30', 30", while the secondary input converter 31 likewise exhibits windings 31, 31', B".

From the primary-side current converter C, which is designed with three phases (C, 10', 10"), the associated lines 25, 25', 25" now lead to the previously mentioned input windings of the input converter A.

The same holds true for the secondary side, where the lines 26, 26', 26" are connected to input windings B, 31', 31". The connection to ground 19 is carried out via lines 34, 35, whereby the current converters C, D are also connected to ground 19 via lines 32, 33.

Figure 3:
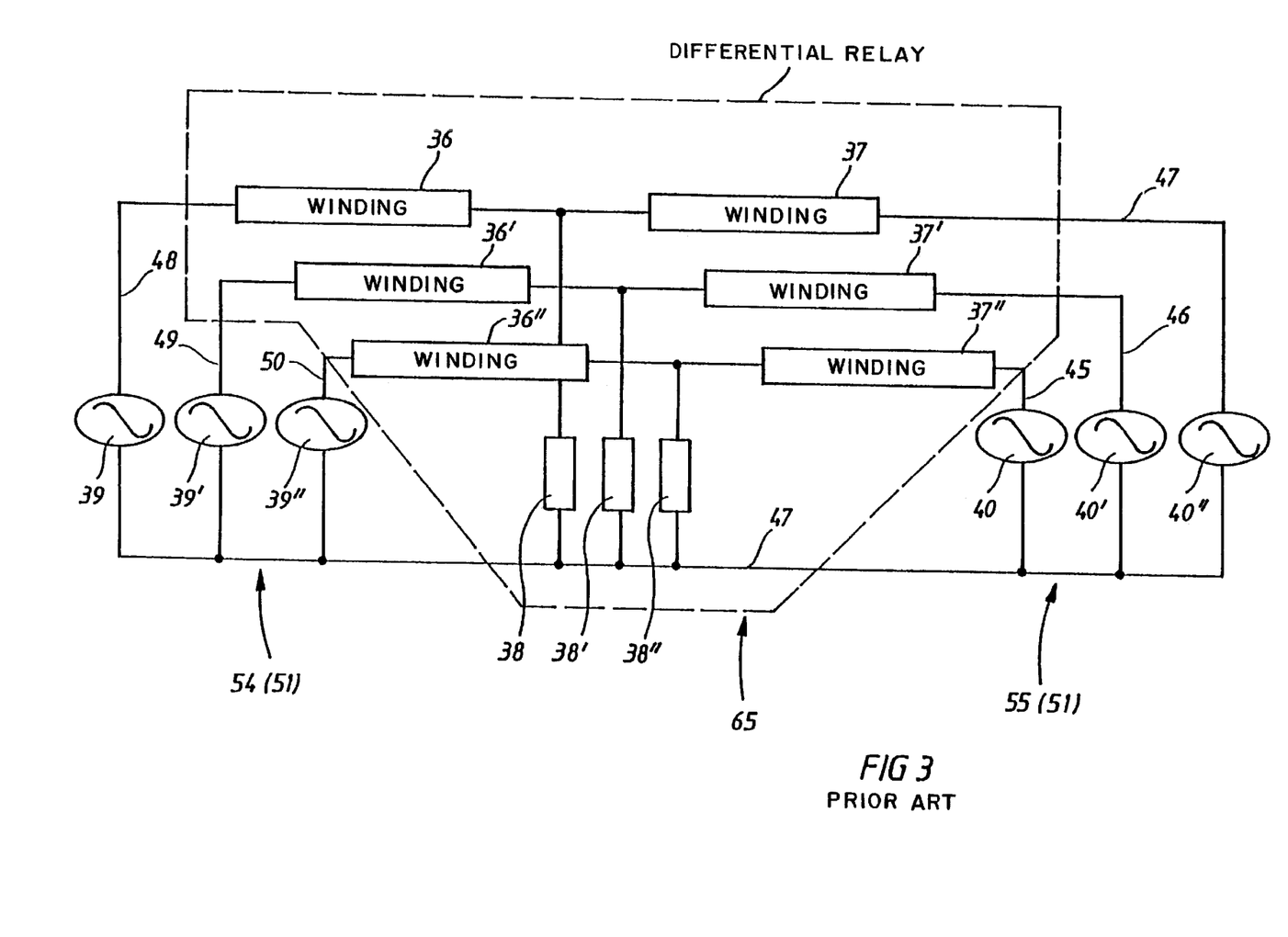
FIG. 3: The connection of test values to a conventional differential protective relay.

In this way, a current $I'_{PL}$ and $I'_{SL}$ is impressed on the protective relay by input converters A, B respectively, whereby these currents are the transformed primary currents $I_{PL}$ and $I_{SL}$ FIG. 3 shows the connecting of test values to a conventional differential relay 65 with symmetrical primary- and secondary-side holding windings 36, 37 and differential windings 38 placed in between.

On the primary side, the test values (test currents) are applied to the associated holding windings by means of current generators 39, 39', 39", while on the secondary side the corresponding test values are also applied to holding windings 37, 37', 37" by means of current generators 40, 40', 40".

It is essential that the cited current generators 39, 40 are part of the test arrangement 54, 55 in accordance with the invention, which is in turn a component of the test facility 51 in accordance with the invention.

Figure 4:
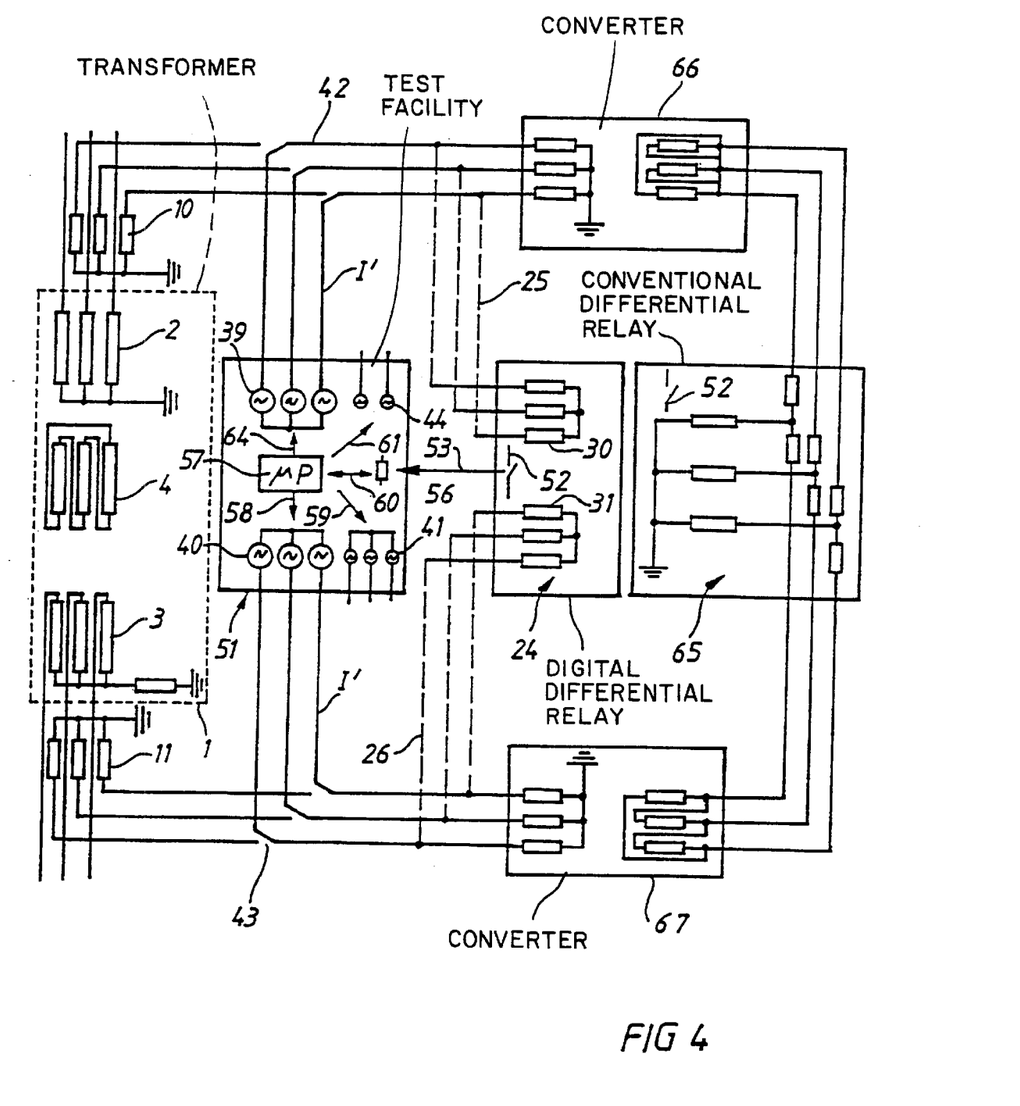
FIG. 4: A more exact representation of the test equipment in accordance with the invention, with connection to the differential protective relay to be tested.

By means of FIG. 4 it is shown in more detail that it is essential to the invention that the cited current generators 39, 40 according to FIG. 3 are triggered digitally, and now carry out a test program which can be preset within freely definable limits, and by means of which it is possible to test all of the current-carrying parts of the numerical differential protective relay or conventional differential protective system which is to be tested, and specifically, by presetting the most widely varying parameters.

This is shown in more detail in FIG. 4.

FIG. 4 shows the practical connection of a digital differential relay 24 or a conventional differential relay 65, including matching converters 66, 67, to the primary and secondary current converters C, D of the transformer 1 to be protected, with its, primary winding 2, secondary winding 3 and tertiary winding 4. It can be seen that the differential relay 24 contains no holding and differential windings, and measure only the line current via the device input converters A, B.

The differential protective system 65 or the numerical differential protective relay 24 can process up to 11 currents from three windings and two ground current converters. The test facility 51 takes this into account as well with up to 11 current generators 39–41, 44 which are controlled independently by means of a microprocessor 57. Each current generator 39–41, 44 is connected to a relay input converter A, B or matching converter 66, 67. The currents, which are calculated by the test facility 51 with the aid of the model of the particular piece of electrical equipment 1 to be protected, are output to the primary-, secondary- and, if applicable, tertiary-side device input converters A, B or matching converters 66, 67 via the connector block or test switches 42, 43, depending on the way they are connected. All o the functions of the differential protective system to be checked are thus to be tested under realistic operating conditions, since any current values corresponding to the selected fault types can be simulated. The individual, separately controllable current generators 39–41, 44 of the test facility 51 are triggered and synchronized via control bus lines 58–61, 64 from the microprocessor 57. Through the use of a test program running in the microprocessor 57, any desired test conditions which recreate the real operating conditions to be expected can be simulated.

In addition, it is shown that the differential protective relay 24 exhibits at least one switch 52 which is connected with the test facility 51 via a line 53 and a binary input 56. The reaction of the differential relay 24 is read out via this switch 52, and is sent as a signal to the binary input so the test facility 51 can record and process the response of the item under test on the basis of the various test programs.

Of course, it is not necessary to pass the test response along to the test facility in the form of a switch signal; other signal inputs are also possible, by means of which the reaction of the item under test is recorded and compared with associated parameters that are stored in the test facility.

Figure 5:
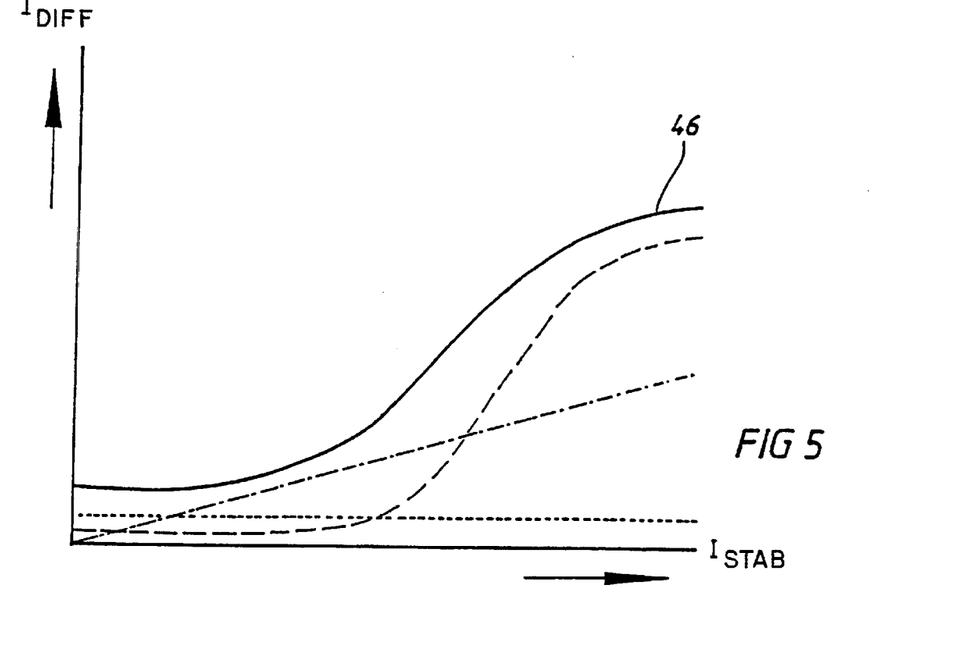
FIG. 5: Diagram of the operational differential current characteristic curve as a function of various parameters.

Shown in FIG. 5 with the aid of a diagram is the dependency of the differential current on the flow-through current (stabilization current). It can be seen in this regard that the resulting operational differential current characteristic curve 46 is not a straight line.

The differential current $I_{DIFF}$ is formed from the difference of the matched transformed currents $I'_{PL}$ and $I'_{SL}$, and is purely a calculated value for fault detection.

It thus can be seen from this diagram that one ha various fault influences, which results in the fact that a threshold value for the resulting tripping o the protective relay should not be set by means of a fixed value of $I_{DIFF}$ alone.

The operational differential current characteristic curve 46 results from the summation of the various operational differential currents as a function of the stabilization current.

Figure 6:
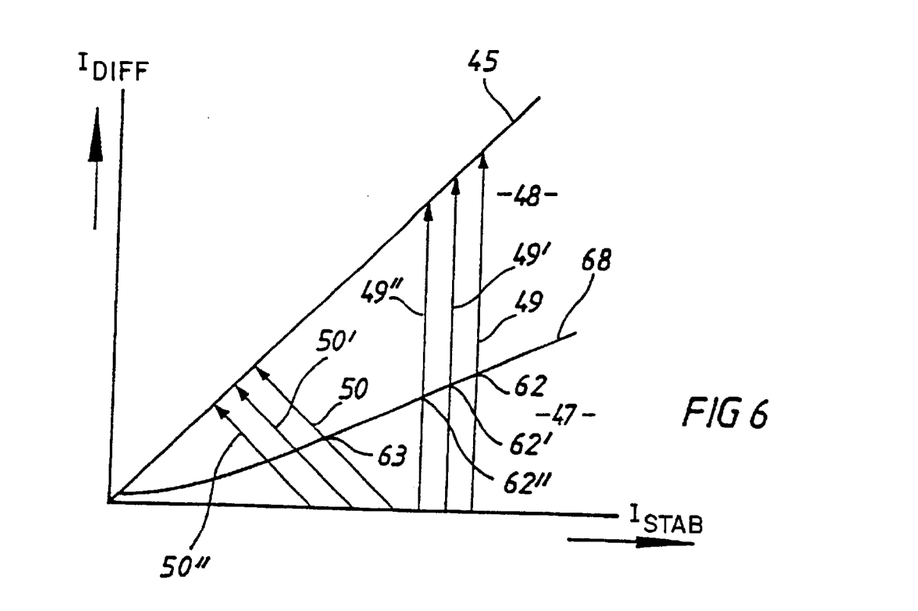
FIG. 6: Representation of the test method in the level per FIG. 5.

Shown in FIG. 6 is the test method in the form of a diagram, and one can see that a straight line 45 which is inclined at 45° is present, below which the trip characteristic curve 68 of the relay to be tested is drawn as a function of the differential current and the stabilization current.

In the region below the trip characteristic curve 68, the relay should stabilize, i.e., not trip, and for that reason this region is called the stabilization region 47.

Above the trip characteristic curve 68, the relay should trip, and for that reason this region is called the trip region

48. A series of straight test lines 49, 49', 49" is drawn in, which have the following meaning:

Set along these straight test lines 49 are test points which can lie both in the triggering region as well as in the stabilization region.

This is done with the goal of finding an operating point on this trip characteristic curve, i.e., finding the exact point of intersection 62 at which the relay trips, or to put it more precisely, at which it makes the transition from the stabilization region 47 into the trip region 48.

Such tests can be repeated in the entire level in order to find and represent the relay's trip characteristic curve 68, which extends through the level.

Additional straight test lines 50, 50', 50" are drawn in, which test according to a different method and which also result in corresponding points of intersection 63 with the trip characteristic curve 68.

Furthermore, it is also essential that the entire test program does not just determine the current position of the trip characteristic curve 68, but rather also automatically carries out a nominal-actual comparison between the trip characteristic curve indicated by the manufacturer and the trip characteristic curve actually found in accordance with the specific tolerance information.

Using the protected object parameters specified in accordance with the $I_{DIFF}$ and $I_{STAB}$ values, the test facility calculates the primary, secondary and tertiary test currents.

Figure 7:
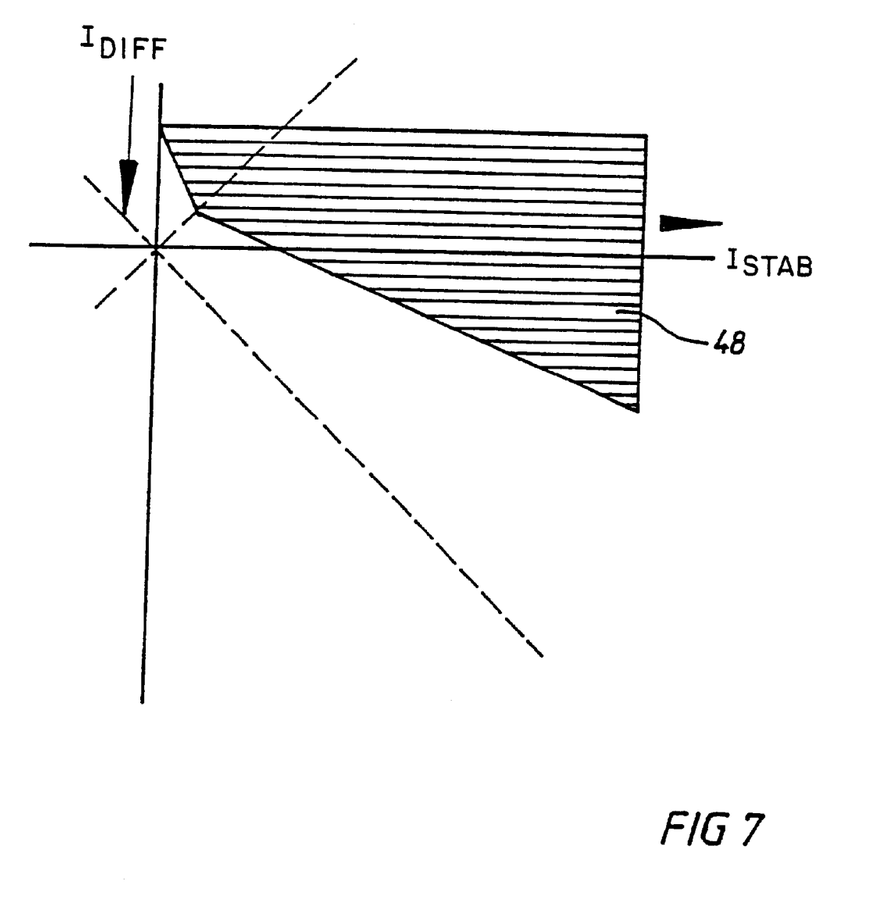
FIG. 7: Characteristic region of the matched comparison currents while observing the same angle.

FIG. 7 shows the characteristic region $I_S=f(I_P)$ of the two virtual (matched) currents of the ends to be compared. This characteristic region is obtained when testing is done in accordance with the straight lines 50, 50', 50' in FIG. 6. FIG. 7 is thus just a different representation of the relationship $I_{DIFF}=f(I_{STAB})$.

What is claimed is:

1. Method of the testing differential protective relays and systems, comprising the steps of simulating electrical equipment to be protected by a differential protective relay, said electrical equipment including power transformers at one electric station location, along with all its important criteria by means of a test system; outputting test currents calculated in the test system, which are dependent upon on the pieces and parameters of the electrical equipment to be protected, to the differential protective relay connected to the test system; recording by means of the test system the test currents and the operational and fault behavior of the differential protective relay; and evaluating specified tolerance information of the differential protective relay.

2. Method in accordance with claim 1, wherein the differential protective relay to be tested is simultaneously contacted by multiple synchronized test currents, all of which can be controlled in magnitude and phase position individually and independently.

3. Method in accordance with claim 1, wherein the specification of the test values is carried out in the transformed level of the trip characteristic curve $I_{DIFF}=f(I_{STAB})$ or the matched transformed currents $I_S=f(I_P)$, whereby the test system automatically calculates the necessary secondary test currents as a function of the simulated piece of electrical equipment, the current converter ratios, the fault type and the fault location, and outputs them to the differential protective relay to be tested.

4. Method in accordance with claim 1, wherein the multiple-side, three-phase secondary current feed and protective system-related testing, in supplementing other, existing test methods, replaces and improves the primary current text (380-volt test) carried out upon startup, particularly in the case of transformers.

5. Method in accordance with claim 1, wherein the protected object simulation, calculation of test values, generation of test values, control of the test run, and processing and evaluation of the results is carried out by means of software.

6. Device for the testing of differential protective relays and systems in accordance with the method according to claim 1 characterized by:

microprocessor control (57);

multiple current generators (39–41, 44) which can be synchronized and controlled in their parameters individually and independently of each other via the microprocessor control (57);

at least one signal input (56) for connecting the switch outputs (52) of the differential protective relay (24, 65) to be tested.

7. Method in accordance with claim 1, characterized by the fact that a three-phase connection of the test currents is made to each winding of a system to be tested.

8. Method in accordance with claim 7, wherein the differential protective relay to be tested is simultaneously contacted by multiple synchronized test currents, all of which can be controlled in magnitude and phase position individually and independently.

9. Method in accordance with claim 7, wherein the specification of the test values is carried out in the transformed level of the trip characteristic curve $I_{DIFF}=f(I_{STAB})$ or the matched transformed currents $I_S=f(I_P)$, whereby the test system automatically calculates the necessary secondary test currents as a function of the simulated piece of electrical equipment, the current converter ratios, the fault type and the fault location, and outputs them to the differential protective relay to be tested.

10. Method in accordance with claim 7, wherein the multiple-side, three-phase secondary current feed and protective system-related testing, in supplementing other, existing test methods, replaces and improves the primary current text (380-volt test) carried out upon startup, particularly in the case of transformers.

11. Method in accordance with claim 7, wherein the protected object simulation, calculation of test values, generation of test values, control of the test run, and processing and evaluation of the results is carried out by means of software.

12. Device for the testing of differential protective relays and systems in accordance with the method according to claim 7 characterized by:

microprocessor control (57);

multiple current generators (39–41, 44) which can be synchronized and controlled in their parameters individually and independently of each other via the microprocessor control (57);

at least one signal input (56) for connecting the switch outputs (52) of the differential protective relay (24, 65) to be tested.

* * * * *